United States Patent [19]

Master et al.

[11] Patent Number: 4,824,009
[45] Date of Patent: Apr. 25, 1989

[54] PROCESS FOR BRAZE ATTACHMENT OF ELECTRONIC PACKAGE MEMBERS

[75] Inventors: Raj N. Master, Wappingers Falls; Marvin S. Pittler; Paul A. Totta, both of Poughkeepsie; Norman G. Ainslie, Croton-on-Hudson; Paul H. Palmateer, Wappingers Falls, all of N.Y.

[73] Assignee: International Business Machines Corporation, Armonk, N.Y.

[21] Appl. No.: 336,246

[22] Filed: Dec. 31, 1981

[51] Int. Cl.⁴ .............................................. B23K 31/02
[52] U.S. Cl. ..................................... 228/124; 228/232
[58] Field of Search ............................... 228/124, 232

[56] References Cited

U.S. PATENT DOCUMENTS

| | | | |
|---|---|---|---|
| 3,006,069 | 10/1961 | Rhoads et al. | 29/473.1 |
| 3,053,699 | 9/1962 | Irons | 228/263.18 |
| 3,199,189 | 8/1965 | La Plante | 228/263.18 |
| 3,340,602 | 9/1967 | Hontz | 228/232 |
| 3,496,630 | 2/1970 | Duff | 228/231 |
| 3,648,357 | 3/1972 | Green | 228/186 |
| 4,238,848 | 12/1980 | Yamaguchi | 368/276 |
| 4,291,815 | 9/1981 | Gordon | 174/52 FP |
| 4,418,857 | 12/1983 | Ainslee | 228/124 |

FOREIGN PATENT DOCUMENTS

| | | | |
|---|---|---|---|
| 48-14505 | 5/1973 | Japan | 228/122 |
| 53-53551 | 5/1978 | Japan | 228/124 |
| 54-153573 | 12/1979 | Japan | |

OTHER PUBLICATIONS

IBM TECH. DISCL. BULL., vol. 20, No. 8, Jan. 1978, p. 3079, "Depositing Crack-Free Heavy Electroless Nickel Coating", Haddad et al.

Primary Examiner—Kurt Rowan
Attorney, Agent, or Firm—William T. Ellis

[57] ABSTRACT

In the process of braze attachment of electronic package members, such as attaching metallic coated connector pins to a multilayer ceramic substrate, contact areas of the substrate are formed by sequential coatings of molybdenum and nickel, which are heated to diffuse the nickel. A pure gold paste is applied by screen printing, for example, followed by the step of firing to burn out the paste binder and to sinter the pure gold particles onto a dense low porosity structure. The sintering operation converts the Ni film into a continuous Au-Ni solid solution. During pin braze, Ni-Sn intermetallics are dispersed in a gold rich matrix of the Au-Ni solid solution.

8 Claims, 1 Drawing Sheet

PROCESS FOR BRAZE ATTACHMENT OF ELECTRONIC PACKAGE MEMBERS

DESCRIPTION

Technical Field

This invention relates to a process for braze attachment of electronic package members, and in particular to a bonding means for joining connector pins to a multilayer ceramic substrate.

An object of this invention is to provide a strong and nondegradable means for brazing electrical connection elements to a multilayer ceramic substrate.

Background Art

Presently known methods for producing semiconductor chip modules by the assembly of multilayer ceramic substrates with attached connector pins usually encounter serious problems. One problem involves the formation of NiSn intermetallics, such as $Ni_3Sn_2$ and $Ni_3Sn_4$, which are brittle materials. The problem arises as a result of the reaction between tin from the braze and the plated nickel from input/output pads. When the connector pins are subjected to stresses during handling or plugging or unplugging of the module, the intermetallics provide a plane of weakness, so that a fracture eventually occurs at the weak area. Such type of fracture does not lend itself readily to rework for reattachment of the pins. Furthermore, if the number of chip reworks increases, the intermetallic layer grows and forms a continuous layer. As a result of this formation, pin pull strength is degraded.

Another problem found in the manufacture of semiconductor modules with pin connectors, is the undue pin movement and resultant misalignment of the pins with an engaging socket. During rework of semiconductor chips, the temperature used, such as 350° C., is in the solid and liquid phase field. For example, during the subsequent process of chip joining, which occurs at 350° C., Ni-Sn intermetallics are formed. It is known that Au-Sn is eutectic at 285° C. Thus, the braze partially melts and the pin joint allows the pin to tilt so that when the joint solidifies the pin is out of alignment. As a result, the module cannot be plugged into the connector socket properly, and also the pin would not fit in the standard jigs used to hold the substrate during chip rework.

Cross Reference to Copending Patent Application

In copending U.S. patent application Ser. No. 221,606, filed Dec. 31, 1980, now U.S. Pat. No. 4,418,857, and assigned to the same assignee, a method for bonding electrical connection pins and other components to a chip carrying substrate is disclosed. The method provides a gold barrier between the braze and the intermetallics. The melting point of the braze is such that the liquid content at reflow temperature is decreased and pin movement is eliminated.

Brief Description of the Drawing

The invention will be described in detail with reference to the drawing in which.

Disclosure of the Invention

Figure 2:
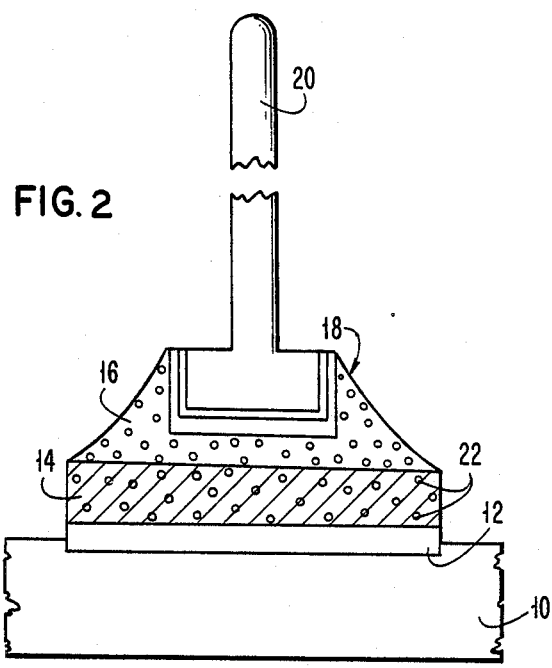
FIGS. 1 and 2 respectively are sectional side views of a multilayer ceramic substrate with an attached connector pin, depicted after one reflow process and ten reflows, in accordance with this invention.
Figure 1:
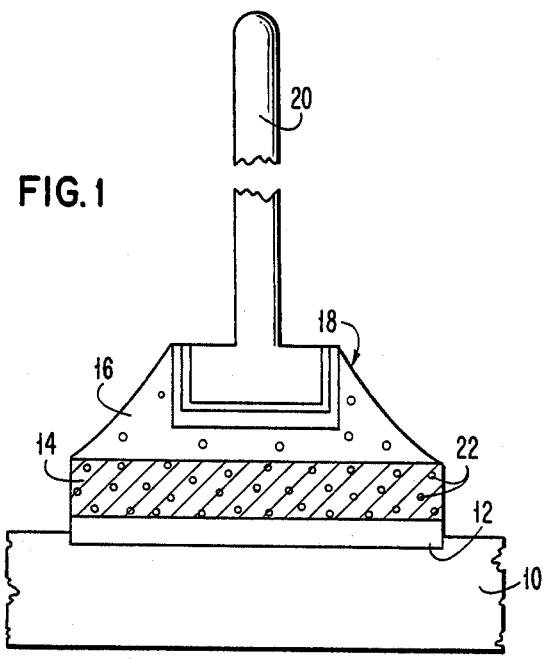

With reference to the drawing, an assembly for supporting an electronic circuit comprises a multilayered ceramic substrate 10 having a molybdenum pad 12 deposited on one surface of the substrate. The molybdenum pad is screened in a green sheet and fired at about 1550° C. A nickel coating 14 is diffused over the molybdenum pad.

In accordance with this invention, a gold paste made of pure gold metal in an organic binder, such as commercially available Engelhard E696A or E684A, for example, is screened onto the nickel coating 14. The gold paste is fired at a temperature in the range of 680°–850° C. to drive off the binders and vehicles as well as densify the gold metallurgy and form a solid solution of gold-nickel. The gold and nickel are completely miscible. The gold paste does not have any glassy phase or oxides as additives. This gold metallurgy is sintered at a temperature of approximately 700° C. in a reducing and/or wet ambient, such as a hydrogen atmosphere. During sintering, the organic binder burns out without residue in the ambient. The liquid phase of Au-Sn interacts with the Ni to produce Ni-Sn and intermetallics.

By means of this invention, in which gold metallurgy is screened onto the molybdenum pad after nickel diffusion, the gold dissolves in Au-Sn 16 (as disclosed in the aforementioned patent application) and raises the melting point, thus preventing degradation between the joint 18 and the pin 20 by maintaining a higher amount of solid phase. The Au-Sn joins the nickel plated Kovar pin 20 to the nickel plated surface 14 on the ceramic substrate head. As an alternative, the pin 20 may be coated with Au-Ni or Au-Pd alloy.

The gold forms a solid solution with the nickel in layer 14 and causes a noncontinuous dispersion of the Ni-Sn intermetallic 22, thereby strengthening the joint due to a phenomenon of dispersion strengthening. With this process, the joint will not degrade as a function of multiple chip reflows. FIG. 2 shows the dispersion of intermetallic 22 after ten reflow operations.

Applicants' invention allows the use of soft dimple headed pins, of 92K psi as an example, so that the failure occurs in the pin shank, and at the joint of the pin shank and head of the pin. This is a desirable failure mode that lends itself to expedient and inexpensive repair as opposed to failure by fracture of the intermetallic layer.

By means of this process, there is no carbonaceous residue that may result from incomplete combustion, which may cause incomplete sintering and porosity of the intermetallics, as experienced in the prior art. Excessive porosity allows the Au-Sn braze to penetrate and react with the nickel to form a continuous layer of intermetallics that are brittle and therefore highly undesirable.

In accordance with this invention, a solid solution of Au-Ni with no continuous layer of intermetallic Ni-Sn is realized for a joint between a connector pin and a ceramic substrate useful for supporting a circuit chip. The intermetallics are effectively dispersed thereby minimizing the chance of fracture in the joint. More gold is made available to strengthen the joint while the intermetallics are reduced.

In an alternate implementation, gold may be plated or screened onto the nickel layer and brought to a high temperature, such as 680° C.–850° C. to produce a gold-nickel solid solution. Another alternative is to sputter a gold-nickel solid solution onto the molybdenum using a gold-nickel cathode.

The invention disclosed herein affords the following features:

1. Formation of a non-degradable braze joint.
2. No pin tilt as a function of reflows.
3. Dispersion strengthening of the joint through formation of Au-Ni solid solution.
4. Sintering of gold to 95-100% density in reducing ambients at 680° C.-850° C.
5. Sintering of gold and diffusion of nickel can be accomplished concurrently.

What is claimed is:

1. A process for joining a metallic coated conductive connector pin to a ceramic substrate comprising the steps of:

depositing a layer of molybdenum on a surface of said substrate;

depositing a film of nickel on said molybdenum layer;

heating said assembly at a specified temperature for diffusing a portion of said nickel into said molybdenum layer;

applying a layer of substantially pure gold to said nickel film followed by sintering said gold, to combine it with undiffused portions of said nickel to form a continuous gold-nickel solid solution; and brazing said connector pin with a gold-tin brazing compound via said gold-nickel solid solution to join said pin to said substrate.

2. A process as in claim 1, wherein said applied gold is a gold paste comprising pure gold in a binder.

3. A process as in claim 2, wherein said gold paste is applied by screening.

4. A process as in claim 2, including the step of firing said gold paste to burn out said binder.

5. A process as in claim 1, wherein said gold is sintered at a temperature in the range of 680° C.-850° C.

6. A process as in claim 1, wherein said connector is a nickel plated Kovar pin.

7. A process as in claim 1, wherein said connector pin is coated with a metal of gold-nickel or gold-palladium.

8. The process as in claim 1 wherein said diffusion employs a portion of said nickel at its interface with molybdenum with said gold forming a solid solution with the remaining portion of said nickel.

* * * * *